US012745478B2

(12) United States Patent
Rissi et al.

(10) Patent No.: US 12,745,478 B2
(45) Date of Patent: Sep. 22, 2026

(54) RADIATION DETECTOR FOR POSITION-RESOLVED DETECTION OF RADIATION

(71) Applicant: Dectris AG, Dättwil (CH)

(72) Inventors: Michael Rissi, Dättwil (CH); Tilman Donath, Dättwil (CH); Christian Disch, Dättwil (CH)

(73) Assignee: Dectris AG, Dättwil (CH)

( * ) Notice: Subject to any disclaimer, the term of this patent is extended or adjusted under 35 U.S.C. 154(b) by 370 days.

(21) Appl. No.: 18/698,018

(22) PCT Filed: Dec. 23, 2021

(86) PCT No.: PCT/EP2021/087538
§ 371 (c)(1),
(2) Date: Apr. 3, 2024

(87) PCT Pub. No.: WO2023/117109
PCT Pub. Date: Jun. 29, 2023

(65) Prior Publication Data
US 2024/0413184 A1 Dec. 12, 2024

(51) Int. Cl.
*H10F 39/00* (2025.01)

(52) U.S. Cl.
CPC ....... *H10F 39/809* (2025.01); *H10F 39/8027* (2025.01); *H10F 39/811* (2025.01)

(58) Field of Classification Search
CPC .................................................... H10F 39/809
See application file for complete search history.

(56) References Cited

U.S. PATENT DOCUMENTS

2010/0327173 A1 12/2010 Woychik et al.
2016/0099277 A1 4/2016 Vora
2016/0099281 A1 4/2016 Vora
2017/0192110 A1* 7/2017 Steadman Booker .. G01T 1/247
2017/0373115 A1* 12/2017 Menichelli .............. G01T 1/164
2019/0033473 A1* 1/2019 Jakubek .................. G01T 1/242
2021/0223420 A1 7/2021 Ullberg
2021/0356608 A1* 11/2021 Jacobs .................. G01T 1/2018

FOREIGN PATENT DOCUMENTS

WO 2021228386 A1 11/2021

OTHER PUBLICATIONS

International Search Report mailed Jul. 21, 2022, for International Application No. PCT/EP2021/087538.

* cited by examiner

*Primary Examiner* — William A Harriston
(74) *Attorney, Agent, or Firm* — RENNER, OTTO, BOISSELLE & SKLAR, LLP

(57) ABSTRACT

A radiation detector for position-resolved detection of radiation comprises at least one sensor tile with sensor material sensitive to the radiation. The sensor tile defines a horizontal plane spanned by a first axis and a second axis orthogonal to the first axis. A set of sensor pixels of electrically conductive material is arranged in the horizontal plane and in contact with the sensor material. The set comprises a subset of inner sensor pixels, wherein an inner sensor pixel has a neighbor sensor pixel in each direction of the first axis and the second axis. At least two neighboring inner sensor pixels of the subset show an extension along the second axis that exceeds an extension along the first axis. The radiation detector further comprises at least one readout chip assigned to the at least one sensor tile and extending along the first axis and the second axis.

20 Claims, 9 Drawing Sheets

RADIATION DETECTOR FOR POSITION-RESOLVED DETECTION OF RADIATION

This application is a national phase of International Application No. PCT/EP2021/087538 filed Dec. 23, 2021, which is hereby incorporated herein by reference in its entirety.

TECHNICAL FIELD

The invention relates to a radiation detector for position-resolved detection of radiation.

BACKGROUND ART

State of the art hybrid pixel detectors (HPD) comprise a pixelated sensor tile, which is connected pixel-by-pixel to a readout chip. In state-of-the art HPDs, usually semiconductors are used as sensor material of the sensor tile. More specifically, a top side of the sensor tile includes a continuous electrode, while a bottom side of the sensor tile comprises separated electrodes in form of metallizations and/or conductive layers in contact with the sensor material and isolated from each other. Such metallization contributes to a sensor pixel. A sensor pixel is connected to an assigned readout circuitry of the readout chip. Each metallization is connected with means of a bump bond manufactured by an under bump metallization (UBM) process to a contact of the assigned readout circuitry. Such contact can also be referred to as electrode of the readout chip.

Ionizing radiation that is desired to be detected and measured interacts with the sensor material and deposits energy in the sensor material. The deposited energy converts to electron-hole pairs in the sensor material. In the sensor material, an electrical field is formed by applying a voltage on the top side electrode of the sensor and setting a virtual ground to an input of a first amplification stage of an assigned readout circuitry. Charges collected in one of the sensor pixels are thus processed in the assigned readout circuitries.

State of the art hybrid pixel detectors have sensor pixels that usually are of quadratic shape. This design is appropriate for many applications, e.g. for computed tomography, for x-ray diffraction application, for scanning transmission electron microscopy, for scanning electron microscopy, or electron microscopy. Common to these applications is that the same resolution is achieved in both directions x and y in view of the quadratic shape of the sensor pixels.

However, when a different resolution is desired to be achieved the same readout chip can no longer be used in most scenarios, or only used in combination with drawbacks:

a) In case of a smaller overall sensor surface being accepted and the size of the sensor tile being reduced in view of smaller sensor pixels, such redesigned sensor tile, if being served by the same readout chip as before, were exceeded by the size of the readout chip by far, which results in a waste of space.

b) In case the readout chip were redesigned to the smaller dimensions of the redesigned sensor tile, a chip redesign has to be realized which consumes lots of efforts and is not economical both in terms of costs and resources.

c) In case the previous sensor tile shall or needs to remain its original size and is filled with additional sensor pixels, and the previous readout chip shall continue to serve this sensor tile, additional readout chips are required to serve the then increased number of sensor pixels on the sensor tile. Such additional readout chips consume a lot of space in both directions x and y.

DISCLOSURE OF THE INVENTION

Hence, it is a general object of the invention to provide a radiation detector that allows for continuously using existing readout chips of a given dimension and/or of a given number of readout circuitries while at the same time gaining flexibility in varying resolution in the set of sensor pixels.

The problem is solved by a radiation detector according to claim 1. The radiation detector allows for a position-resolved detection of radiation, given that it comprises a sensor tile of sensor material sensitive to the radiation, and a set of sensor pixels comprising electrically conductive material in contact with the sensor material. The sensor material can, for example, be one of: Silicon (Si), Gallium Arsenide (GaAs), Cadmium Telluride (CdTe), Cadmium Zinc Telluride (CdZnTe) or Germanium (Ge). The sensor material preferably is selected according to the type of radiation to be detected.

In order to read out the individual sensor pixels of the set, a readout chip is provided, preferably in form of an ASIC (Application Specific Integrated Circuit), which extends in a horizontal plane in parallel to the sensor tile. The readout chip comprises a set of readout circuitries, each readout circuitry preferably being responsible for reading out an assigned sensor pixel.

For clarifying the geometric relationship of components of the radiation detector relative to each other, the sensor tile is determined to extend in a horizontal plane spanned by a first axis and a second axis orthogonal to the first axis. Typically, each of a width of the sensor tile along the first axis and a height along the second axis exceeds, and preferably exceeds by a factor of at least 10, a thickness of the sensor tile along a third axis orthogonal to the first and second axis. The set of sensor pixels is arranged in the horizontal plane, and, thus, covers a portion of the e.g. bottom surface of the sensor tile. A sensor pixel comprises electrically conductive material, e.g. in form of a metallization or an implant, which electrically conductive material is also referred to as bottom electrode. The latter term is derived from its function acting as electrode, preferably in combination with a top electrode, preferably a continuous top electrode on the opposite surface of the sensor tile, i.e. the top surface. The sensor pixels are electrically isolated from each other, preferably by means of isolating gaps between the metallizations or implants.

Radiation is expected to meet the top surface of the sensor tile including the top electrode. Preferably, the top electrode is transparent with respect to the radiation to be detected. Energy deposited by the radiation incident in the sensor material therein converts to electron-hole pairs. Resulting charges are transferred along field lines of an electrical field applied between the top electrode and the set of bottom electrodes. Accordingly, each sensor pixel collects radiation induced charges from an assigned volume in the sensor material. The arrangement of the sensor pixels along the first and the second axis thus allows for a position resolved detection of incident radiation.

Signal processing in each readout circuitry may comprise one or more, and preferably all of amplification, shaping, filtering, discriminating, integrating, storing, and/or counting of the charges in the electrical signal provided by the assigned sensor pixel. Readout circuitries may also provide for inter-pixel communication, which may imply vetoing, summing, filtering of a pixel signal, depending on the signal in the neighboring pixel, or time-delayed integration (TDI). In each readout circuitry, a processed signal may achieve a final state, where it may be stored for a certain time, e.g. until it can be read out. The final state may be represented by one or multiple counter values per readout circuitry, one or multiple analog signals per sensor pixel, or a combination thereof. A readout circuitry may also store previous final states if desired, e.g. in an analog or digital first-in-first-out (FIFO) circuit, in storage cells or similar.

Given that the radiation detector is desired not to waste space outside the area claimed by the sensor tile, the sensor tile preferably is arranged on top of the readout chip with the bottom electrodes facing a top surface of the readout chip. The top surface of the readout chip preferably comprises an electrical contact per readout circuitry.

At least two neighboring inner sensor pixels of the set show an extension along the second axis, e.g. y-axis that exceeds an extension along the first axis, e.g. x-axis. At the same time, for the—preferably inner—readout circuitries serving these two neighboring inner sensor pixels, the dimensioning is set as follows: An extension of each of these readout circuitries along the first axis is different from the extension of the assigned sensor pixel along the first axis, and/or an extension of each of these assigned readout circuitries along the second axis is different from the extension of the assigned sensor pixel along the second axis.

In different words, the extension of the relevant sensor pixels is non-quadratic, and in particular rectangular, while the extension of the associate readout circuitries is different in at least one direction, and preferably in both directions. Accordingly, the relevant neighboring inner sensor pixels provide for different resolutions in x- and y-direction, while the assigned readout circuitries have a different shape.

In particular, in case the readout chip is an existing readout chip to be reused, the at least two neighboring—and preferably all inner sensor pixels of the subset—are designed such that on the one hand different resolutions are achieved in different directions, and on the other hand the geometry of these sensor pixels is different than the geometry of the assigned readout circuitries. In particular, the shape of the readout circuitries may e.g. be quadratic, while the shape of the assigned sensor pixels may be rectangular. Accordingly, it is no longer required that inner sensor pixels and assigned readout circuitries are of the same shape as in conventional radiation detectors.

In particular, it is preferred that the extension of the assigned readout circuitries in one dimension, e.g. along the x-axis, is less than the extension of the sensor pixel in the same direction, while, at the same time, the extension of the readout circuitries along the second dimension, e.g. along the y-axis, exceeds the extension of the sensor pixel in the same direction. Of course, x- and y-axis can be exchanged in the above teaching.

In particular when using an existing readout chip, a different resolution required for an application is achieved by adapting the sensor pixel layout to a shape that provides for different resolutions in x- and y-direction. Hence, rectangular or hexagonal inner sensor pixels are possible, even if the readout circuitries have a quadratic shape as is common in state of the art applications. This enables to use the same readout chip even with multiple different sensor pixel designs subject to the application. This is of advantage, as the development of a readout chip is a significant undertaking. On the other hand, a sensor tile may be redesigned much easier and in much shorter design to production cycles than a new readout chip design.

Specifically, the pixel dimension can be reduced in the direction where a high resolution is required, while the pixel dimension can be increased in the other direction, where a low resolution is sufficient. The present design of the at least two neighboring inner sensor pixels enables these two different direction-dependent resolutions. At the same time, a readout chip can be used in combination with such sensor pixels, which readout chip originally was designed to be used with conventional sensor pixels of quadratic shape. Accordingly, the same readout chip may be used for different resolution requirements, especially by sacrificing the resolution in one direction for enhancing the resolution in the other direction.

For a determination of the terms "extension", "shape", "inner sensor pixel", etc., it is referred to the following:

The set of sensor pixels may comprise all sensor pixels on the sensor tile, or a group of sensor pixels, e.g. arranged distant from another group. The set of sensor pixels typically comprises a subset of inner sensor pixels, wherein an inner sensor pixel has a neighbor sensor pixel in each direction of the first axis and the second axis. Accordingly, there may be another subset of sensor pixels containing outer sensor pixels that do not fulfill the requirement for inner sensor pixels.

The extension of each of the two neighboring inner sensor pixels along the first axis is determined by an extension of the conductive material of the sensor pixel along the first axis plus a distance of a gap between the conductive material of adjacent inner sensor pixels in direction of the first axis. In the same way, the extension of each of the two neighboring inner sensor pixels along the second axis is determined by an extension of the conductive material of the sensor pixel along the second axis plus a distance of a gap between the conductive material of adjacent inner sensor pixels in direction of the second axis.

The set of readout circuitries may comprise all readout circuitries of the readout chip, or a group of readout circuitries. At least those readout circuitries are members of the set, that are electrically connected to the at least two inner sensor pixels of the subset. Typically, the set of readout circuitries comprises all readout circuitries of the readout chip. A subset comprises the inner readout circuitries of the set. An inner readout circuitry shows a readout circuitry in each direction of the first axis and the second axis.

Each readout circuitry is supposed to comprise a contact, preferably at the upper surface of the readout chip that faces the sensor tile. After assembly of the readout chip with the sensor tile, the readout circuitries are—via their respective contact—electrically connected to the assigned sensor pixels/bottom electrodes for receiving an electrical signal therefrom.

An extension of each inner readout circuitry along the first axis is defined by a distance between the contacts of the two outmost inner readout circuitries on the first axis divided by $N_i-1$, with $N_i$ representing the number of inner readout circuitries along the first axis. An extension of each inner readout circuitry along the second axis is defined by a distance between the contacts of the two outmost inner readout circuitries on the second axis divided by $M_i-1$, with $M_i$ representing the number of inner readout circuitries along the second axis. Accordingly, all inner readout circuitries are assumed to have the same extension along the first axis, and the same extension along the second axis.

Generally, when comparing extensions, in particular extensions in x- and y-direction, such as the later introduced measures $x_d$ and $y_d$, equality between extensions shall be assumed in case the extensions compared to each other are within a range of 10%. In particular, a rectangle with a side length ratio of smaller than 1.1:1 and larger than 0.9:1 is considered a square.

The radiation to be detected is ionizing radiation and generally may include e.g. one of electrons above an energy of a few keV up to several 100s of keV in case the HPD is an electron detector, x-rays with an energy of a few 100s of eVs up to several 100s of keV in case the HPD is an x-ray detector, or other types of ionizing radiation. Accordingly, the present radiation detector can be used for imaging applications, but also for the imaging of diffraction patterns formed by x-rays or by electrons.

On the other hand, there are applications that require a high resolution in on one direction, but are rather indifferent about the resolution in the other direction. Such applications include one of e.g. electron energy loss spectroscopy (EELS), small angle x-ray scattering (SAXS), wavelength-dispersive spectroscopy, and others, where it is advantageous if the resolution in one direction (e.g. in x-direction) is higher than in the other direction (e.g. y-direction).

The following embodiments relate to the extensions and shapes of the sensor pixels:

- preferably, the two neighboring inner sensor pixels show the same extension along the first axis and the same extension along the second axis. Accordingly, they are of the same shape. This enables the same resolution along each of the x- and y-axis, if applied to all inner sensor pixel of the subset.
- preferably, the two neighboring inner sensor pixels are of the same rectangular shape, i.e. the area of the conductive material is of essentially rectangular shape. A rectangular shape maximizes the area covered by sensor pixels with different extensions in x- and y-direction.
- preferably, the two neighboring inner sensor pixels each show an extension along the second axis that exceeds an extension along the first axis at least by factor four. Accordingly, the difference in resolution is not negligible. By means of this embodiment, the resolution along one axis can be significantly increased at the cost of the resolution along the other axis.
- preferably, all inner sensor pixels of the subset are of the same rectangular shape. The benefits of this embodiment are already mentioned above.
- preferably, all sensor pixels of the set are of the same rectangular shape, which applies a constant resolution per axis across the entire sensor tile.
- preferably, at least four, and preferably all inner sensor pixels of the subset are of the same rectangular shape and are arranged in a two-dimensional array along the first and the second axis. In this context, an array is understood as regular arrangement of sensor pixels wherein the rectangular sensor pixels of a column extend in width all between the same x-coordinates, while the rectangular sensor pixels of a row extend in height all between the same y coordinates. Accordingly, there is no shift or offset between sensor pixels of the same column and the same row. This enables a constant resolution in both directions.
- other than in the previous embodiment, in a different embodiment, at least four, and preferably all inner sensor pixels of the subset are of the same rectangular shape and are arranged in one of rows offset relative to each other and columns offset relative to each other.
- preferably, the offset is at maximum half of the extension of the inner sensor pixel along the offset axis.
- preferably, the offset is half of the extension of the inner sensor pixel along the offset axis.
- preferably, the offset is a third of the extension of the inner sensor pixel along the offset axis,
- preferably, the offset is the sensor pixel extension in the offset axis divided by an integer, wherein a maximum integer for the divisional operation is less than a number of readout circuitries along the axis orthogonal to the offset axis.
- preferably each of the two neighboring inner sensor pixels are of the same rectangular shape and comprise a local asymmetry in a region where an electrical contact means, such as a bumpbond engages with the sensor pixel for connecting the sensor pixel to the assigned readout circuitry. This enables a straight vertical connection to quadratic readout circuitries underneath with a centered contact.
- preferably, the local asymmetry is represented by a bulge on a boarder of the sensor pixel. This minimizes the variation irregular shape between inner sensor pixel areas.
- preferably, each of the two neighboring inner sensor pixels comprises another local asymmetry in form of a recess complementing the bulge of the neighboring sensor pixel. This enables the bulges in the neighboring sensor pixel.

The following embodiments relate to the extensions and shapes of the readout circuitries:

- preferably, the two inner readout circuitries each show the same extension along the first axis and along the second axis. This results in quadratic inner readout circuitries, which is the shape of readout circuitries in many conventional readout chips.
- preferably all inner readout circuitries of the subset are of the same quadratic shape,
- preferably all readout circuitries of the set are of the same quadratic shape.
- preferably at least four, and preferably all inner readout circuitries of the subset are of the same quadratic shape and are arranged in a two-dimensional array along the first and the second axis. Again, an array is understood as regular arrangement wherein the quadratic readout circuitries of a column extend in width all between the same x-coordinates, while the rectangular readout circuitries of a row extend in height all between the same y coordinates. Accordingly, there is no shift or offset between readout circuitries of the same column and the same row. This enables a packed arrangement of readout circuitries.

The following embodiments relate more explicitly to the extensions of the sensor pixels in relation to the extensions of the readout circuitries. Accordingly, these embodiments deal with the resolution achieved, while at the same time maintaining the footprint claimed by the sensor tile-readout circuit arrangement:

- preferably, the extension of each of the two inner readout circuitries along the first axis exceeds the extension of the assigned sensor pixel along the first axis. This geometry paves the way for one readout circuitry overlapping two sensor pixels.
- preferably, the extension of each of the two inner readout circuitries along the second axis is less than the extension of the assigned sensor pixel along the second axis. This geometry paves the way for one readout circuitry overlapping two assigned sensor pixels and allowing the second readout circuitry overlapping the two assigned sensor pixels, too.

preferably, the extension of each of the two inner readout circuitries along the first axis is at least twice the extension of the assigned sensor pixel along the first axis. This geometry paves the way for the readout circuitries claiming no more area than the sensor pixels.

preferably, the extension along the second axis of each of the two inner readout circuitries is half the extension of the assigned sensor pixel along the second axis or less.

preferably, the extension along the first axis of each of the two inner readout circuitries is twice the extension of the assigned sensor pixel along the first axis, and the extension along the second axis of each of the two inner readout circuitries is half the extension of the assigned sensor pixel along the second axis. This geometry implements a 2:1 ratio of resolutions while the two readout circuitries and the two assigned sensor pixels claiming the same area.

preferably, the extension along the first axis of each of the two inner readout circuitries is 3/2 times the extension of the assigned sensor pixel along the first axis, and wherein the extension along the second axis of each of the two inner readout circuitries is ⅔ times the extension of the assigned sensor pixel along the second axis. This geometry, implements a 3:2 ratio of resolutions while six readout circuitries and the six assigned sensor pixels may claim the same area.

The following embodiments relate to geometries of sensor pixels and readout circuitries in relation to each other:

preferably, the two neighboring inner sensor pixels are arranged next to each other along the first axis in combination spanning a rectangle, and the assigned two inner readout circuitries are arranged next to each other along the second axis thereby spanning a rectangle congruent with the rectangle spanned by the two neighboring inner sensor pixels. Hence, every pairs of inner sensor pixels and readout circuitries are of the same size and preferably may fully overlap, as will be introduced in the following embodiment.

preferably, the rectangle spanned by the two neighboring inner sensor pixels has the same position along the first and the second axis as the rectangle spanned by the assigned two inner readout circuitries.

preferably, the rectangle spanned by the two neighboring inner sensor pixels does not overlap with the rectangle spanned by the assigned two inner readout circuitries. Preferably, a redistribution layer is applied in connection with this embodiment, as will be explained later on.

preferably, at least one of the two inner readout circuitries of the subset is out of overlap with the assigned sensor pixel.

preferably, each of the inner sensor pixels of the subset claims an area exceeding the area of the assigned inner readout circuitry, the area of which assigned inner readout circuitry is determined by its extension along the first axis times its extension along the second axis.

preferably, all inner sensor pixels of the subset claim a combined area exceed a combined area of all inner readout circuitries of the subset, the combined area being determined by the extension of the inner readout circuitry along the first axis times the extension of the readout circuitry extension along the second axis times the number of inner readout circuitries.

In another preferred embodiment, a rerouting or redistribution layer is arranged between the sensor tile and the readout chip. The rerouting layer preferably serves to electrically connect the sensor pixels to the UBM contacts of the assigned readout circuitries. The rerouting layer can be deposited on the bottom electrodes metallized on the sensor surface. Preferably, the rerouting layer comprises an insulating material and conductive traces arranged between the sensor tile and the readout chip.

Each conductive material of a sensor pixel may be included in a stack of layers forming the individual electrodes on the bottom side of the sensor tile. Such stack may for example include n++ or p++ implant/s, different metals, insulation layer/s, e.g. SiO, SiN, . . . , under bump metallization, etc. The different layers in this stack may not need to have the same size. A top layer of the stack may define an area where the electric field inside the sensor tile will bend towards. Electric charges of one polarity (either electrons or holes, depending on the polarity of the applied voltage) created in response to the energy impact of the ionizing radiation will drift along the electric field lines towards the top layer of the stack. E.g. combining this stack with insulating layers and through-vias through the insulating layer, this construction may be used to route signals from a x-y position where the top layer of the stack is to a different x-y position where the bottom layer of the stack is. This may even be used to cross the x-y region covered by the top layer of a different sensor's pixel stack.

Typical readout circuitry extensions may be, if quadratic: Between 10 μm×10 μm and 2 mm×2 mm and, if rectangular between 10 μm and 2 mm, each width and height. Typical sensor pixel extensions may be: between 10 μm and 10 mm, each width and height.

The embodiments in the above categories can be applied stand alone or in combination with one or more other embodiments of the same category, or with one or more embodiments of a different category, or with one of more embodiments of different categories.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE DRAWINGS

Figure 1:
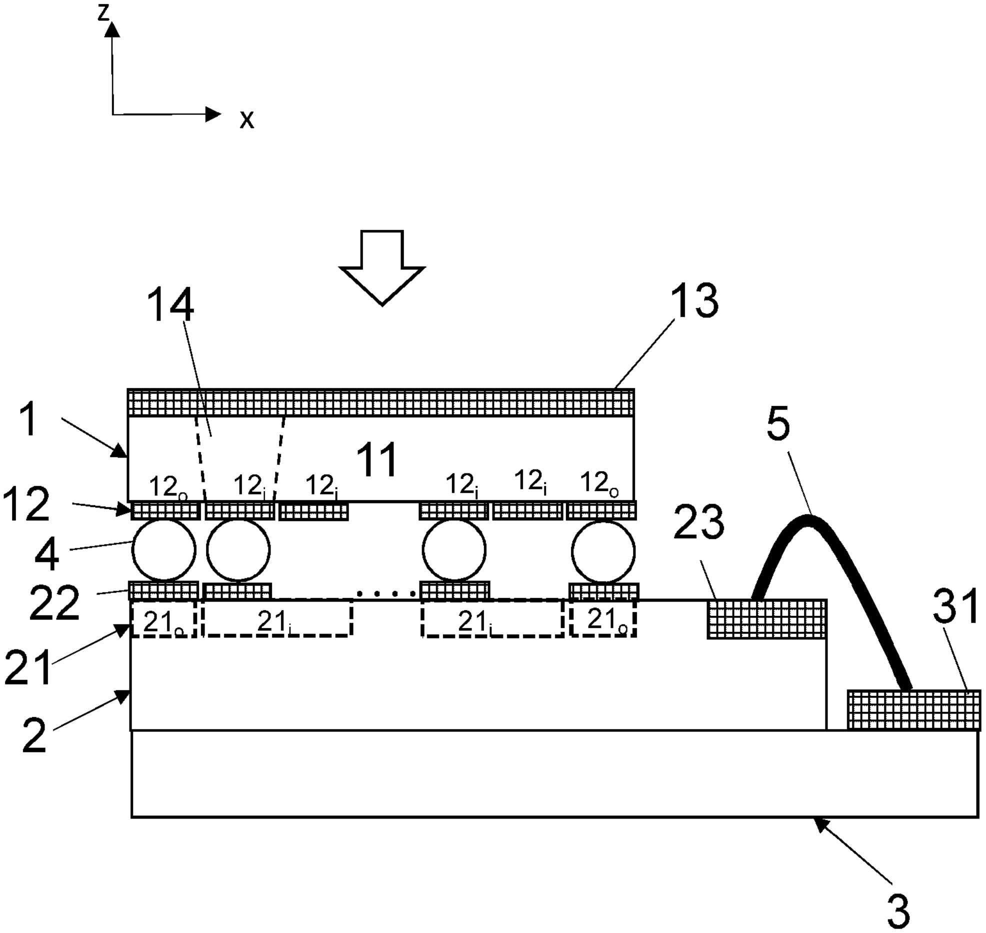
FIG. 1 illustrates a cut view of a radiation detector according to an embodiment of the present invention.

FIG. 1 illustrates a cut view of a radiation detector according to an embodiment of the present invention. A sensor tile 1 is electrically connected to a readout chip 2, which in turn is electrically connected to a circuit board 3. The sensor tile 1 comprises sensor material 11 that is sandwiched between a continuous top electrode 13 and multiple separated bottom electrodes 12, represented by electrically conductive material, e.g. in form of metallizations, contributing to sensor pixels. The sensor material is sensitive to radiation to be detected. The radiation is assumed to hit the sensor tile 1 from the top, as indicated by the arrow.

The sensor tile 1 is arranged in a horizontal plane x, y, wherein, in the present example, the x-axis is referred to as first axis and the y-axis is referred to as second axis orthogonal to the first axis, in combination defining the horizontal plane. The sensor tile is characterized by a plane extension in the horizontal plane given that its extension in the first and second axis each exceeds its thickness in z-direction, i.e. the third axis.

The readout chip 2 also has its main extension along the first and second axis x, y, is arranged in parallel to the sensor tile 1, and in particular is arranged underneath the sensor tile 1. The readout chip 2 comprises readout circuitries 21, as well as electrical input contacts 22 on its top surface. Preferably, each readout circuit 21 has an assigned input contact 22 to receive an input signal from. Preferably, the sensor pixels 12 of the sensor tile 1 and the input contacts 22 of the readout chip 2 are electrically connected to each other in a one-to-one relationship, meaning that the number of input contacts 22/readout circuitries 21 is equal to the number of sensor pixels 12. In the present example, corresponding sensor pixels 12 and input contacts 22 are located above/below each other along the third axis, and presently are electrically connected by bump bonds 4. Inner sensor pixels are referred to by $\mathbf{12}_i$, while outer sensor pixels are referred to by $\mathbf{12}_o$. Inner readout circuitries are referred to by $\mathbf{21}_i$, while outer readout circuitries are referred to by $\mathbf{21}_o$.

The radiation detector in FIG. 1 is mounted to a high density interconnect (HDI) printed circuit board 3 with additional read out electronics. An electrical connection between I/O pads 23 of the readout chip 2 and I/O pads 31 of the HDI PCB 3 is established by wire bonds 5, for example.

Incident radiation that is desired to be detected and measured interacts with the sensor material 11 comprised in the sensor tile 1 and deposits energy in the sensor material 11. The deposited energy converts to electron-hole pairs in the sensor material 11.

Figure 2:
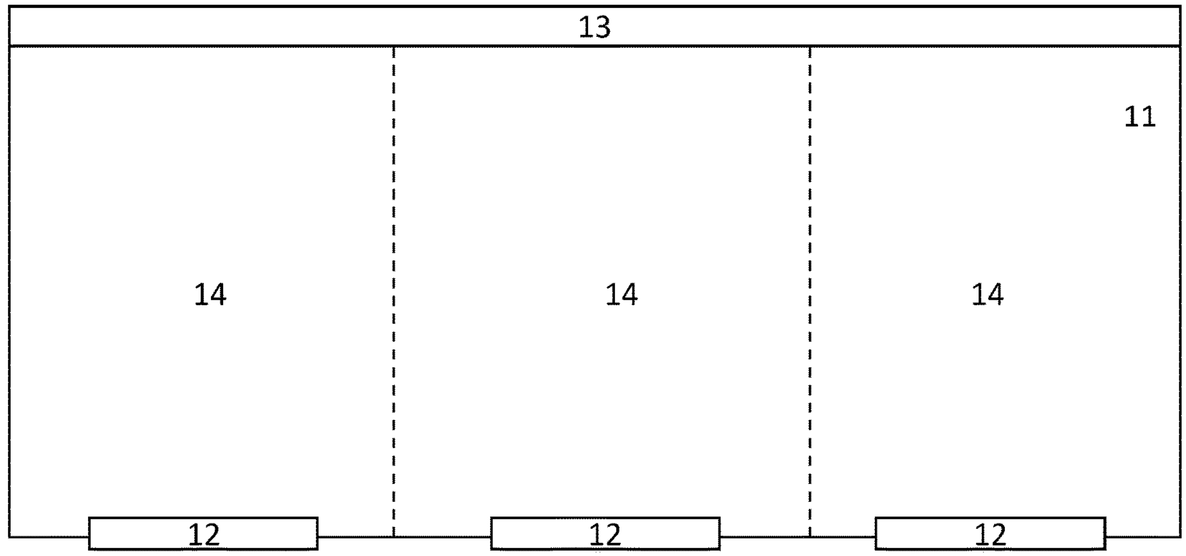
FIG. 2 illustrates a cut out view of the sensor tile 1 of FIG. 1.
Figure 2:
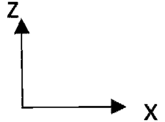

FIG. 2 illustrates a cut out view of the sensor tile 1 of FIG. 1. A positive or negative voltage is applied to the continuous top electrode 13. The top electrode 13 may consist of a stack built up from a sensor implant e.g. p++, n++, metals e.g. one or more of Al, Au, Ag, Cu, . . . , other electrically conductive layers and/or insulating layers. The bottom electrodes 12 may be represented by a stack of layers, too. Electric field lines lead from the top electrode 13 to the bottom electrodes 12. Charges created in the sensor material 11 drift along the field lines. In FIG. 2, all layers in the bottom electrode's stack 12 have the same size and in particular the same extension along the first axis x. The borders of a volume 14 assigned to each sensor pixel 12 are displayed as dashed lines.

Accordingly, each sensor pixel 12 collects radiation induced charges from an assigned volume 14 in the sensor material 11 illustrated for all sensor pixels 12 in FIG. 2, and illustrated only for one sensor pixel 12 in FIG. 1.

Returning to FIG. 1, the charge collected from the assigned volume 14 reaches via the assigned metallization 21, the assigned bump bonding 4 and the respective contact 22 the readout circuitry 21 where it is processed. The readout circuitry 21 preferably is represented by electronics integrated in the semiconductor material of the readout chip 2. Preferably, each readout circuitry 21 serves a dedicated sensor pixel 12, and as such is isolated from other readout circuitries 21 and their contacts 22 as long as the results of the processing in the individual readout circuitries 21 are not combined and forwarded, multiplexed etc. for being sent to the PCB 3. Accordingly, a readout circuitry 21 is indicated by a dotted rectangle in connection with the assigned contact but separate from neighboring readout circuitries 21, also for the reason that each readout circuitry consumes an area of the readout chip 2 in the horizontal plane x, y.

In the cut view of FIG. 1, the sensor pixels 12 all have the same extension along the first axis x. The extension of each inner sensor pixel $\mathbf{12}_i$ along the second axis y exceeds its extension along the first axis x. Preferably, the extension along the second axis y of all the inner sensor pixels $\mathbf{12}_i$ is the same, such that presently the inner sensor pixels $\mathbf{12}_i$ are of the identical rectangular shape.

As can already be derived from FIG. 1, the extension of each inner readout circuitry $\mathbf{21}_i$ along the first axis x exceeds the extension of each inner sensor pixel $\mathbf{12}_i$ along the first axis x, and preferably is the same for all inner readout circuitries $\mathbf{21}_i$. Preferably, as cannot be derived from FIG. 1, the extension of the inner readout circuitries $\mathbf{21}_i$ along the second axis y is less that the extension of the inner sensor pixels $\mathbf{12}_i$ along the second axis y. Preferably, the extension of each inner readout circuitries $\mathbf{21}_i$ along the second axis y is the same as along the first axis x, such that the inner readout circuitries $\mathbf{21}_i$ are of identical quadratic shape.

Preferably, but not conceivable from FIG. 1, the extension of each inner readout circuitry $\mathbf{21}_i$ along the second axis y is half the extension of the assigned inner sensor pixel $\mathbf{12}_i$, and the extension of each inner readout circuitry along the first axis x is double the extension of the assigned inner sensor pixel $\mathbf{12}_i$ along the first axis x.

In the cut view of FIG. 1, some inner sensor pixels $\mathbf{12}_i$ are not illustrated as electrically connected to an assigned inner readout circuitry $\mathbf{21}_i$. The reason for this is that such inner sensor pixels $\mathbf{12}_i$ are electrically connected by means of bump bondings to assigned readout circuitries bot not conceivable from FIG. 1 since arranged in a plane x, z with y>0. This will be better understood in connection with the subsequent Figures.

The radiation detector of FIG. 1 provides a resolution along the second axis y that is lower than along the first axis x. The corresponding inner readout circuitries $\mathbf{21}_i$ are of a different shape than the corresponding sensor pixels $\mathbf{12}_i$ and claim the same area of the readout chip 2 underneath the sensor pixels $\mathbf{12}_i$.

Figure 3:
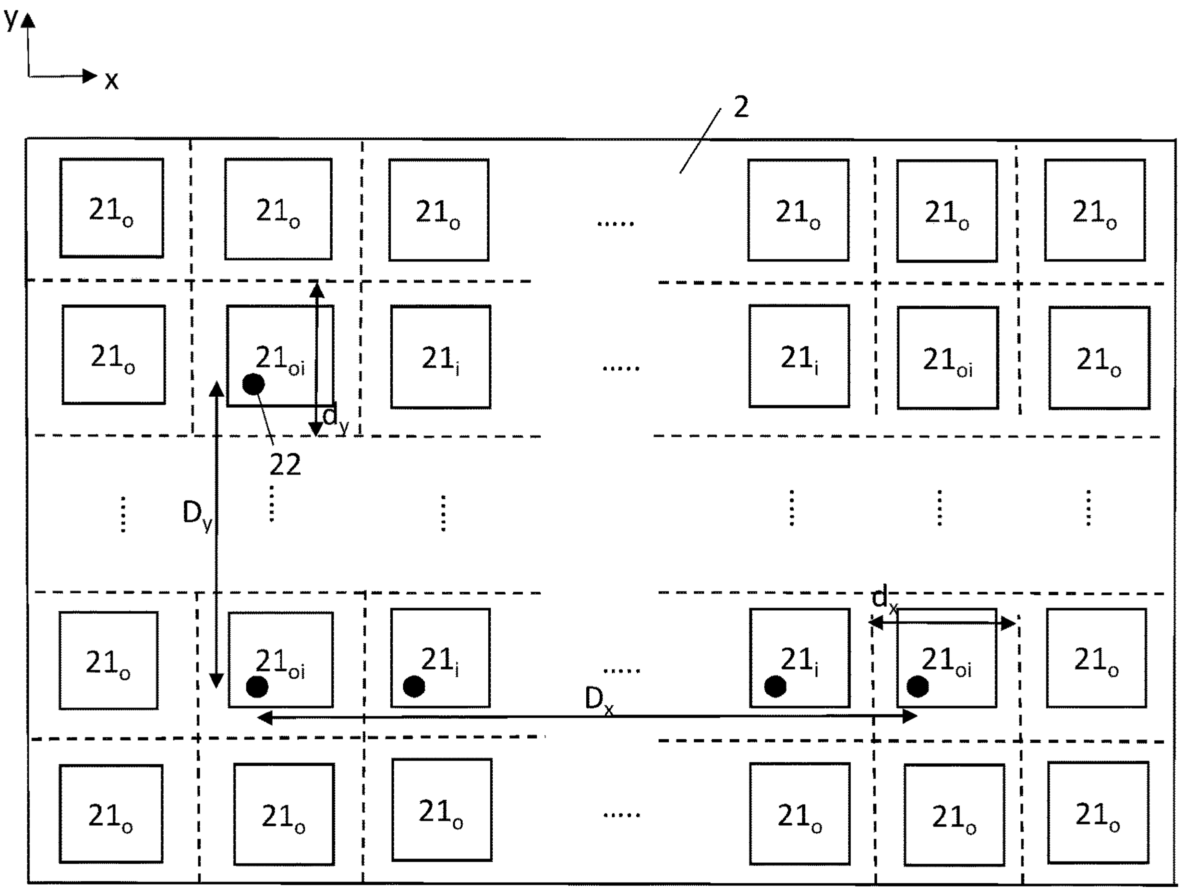
FIG. 3 illustrates a top view on an readout chip of a radiation detector according to an embodiment of the present invention.

FIG. 3 illustrates a top view on a cutout of a readout chip 2 as used in a radiation detector according to an embodiment of the present invention. In the present embodiment, the set of readout circuitries 21 is arranged in an array in rows and columns. The set contains the subset of outer readout circuitries $\mathbf{21}_o$ and the subset of inner readout circuitries $\mathbf{21}_i$. In particular, the four outmost inner readout circuitries in each direction x, y are denoted by $\mathbf{21}_{oi}$. In addition, the input contacts 22 are illustrated by a dot at least for some of the readout circuitries 21. In the present example, the input contacts 22 are arranged in the lower left quarter of each readout circuitry 21. However, the input contacts 22 may alternatively be arranged in the center of each readout circuitry 21, at a different location, or even at locations varying across the readout circuitries 21. In this embodiment, the readout circuitries 21 have an essentially quadratic shape.

For the purpose of comparing the sizes and/or shapes of the readout circuitries 21 with those of the assigned sensor pixels, the following assumption is taken as illustrated in connection with FIG. 3:

As to the extension dx of each inner readout circuitry $\mathbf{21}_i/\mathbf{21}_{oj}$ along the first axis x, a distance $D_x$ is measured between the contacts 22 of the outmost inner readout circuitries $\mathbf{21}_{oi}$ along the first axis x, which distance $D_x$ is divided by $N_i-1$, with $N_i$ representing the number of inner readout circuitries $\mathbf{21}_i/\mathbf{21}_{oi}$ along the first axis x The result is the extension $d_x$ each inner readout circuitry $\mathbf{21}_i/\mathbf{21}_{oj}$ is determined to have along the first axis x.

In the same way, a distance $D_y$ is measured between the contacts 22 of the outmost inner readout circuitries $\mathbf{21}_{oi}$ along the second axis y, which distance $D_y$ is divided by $M_i-1$, with $M_i$ representing the number of inner readout circuitries $\mathbf{21}_i/\mathbf{21}_{oi}$ along the second axis y. The result is the extension $d_y$ each inner readout circuitry $\mathbf{21}_i/\mathbf{21}_{oi}$ is determined to have along the second axis y.

Figure 4:
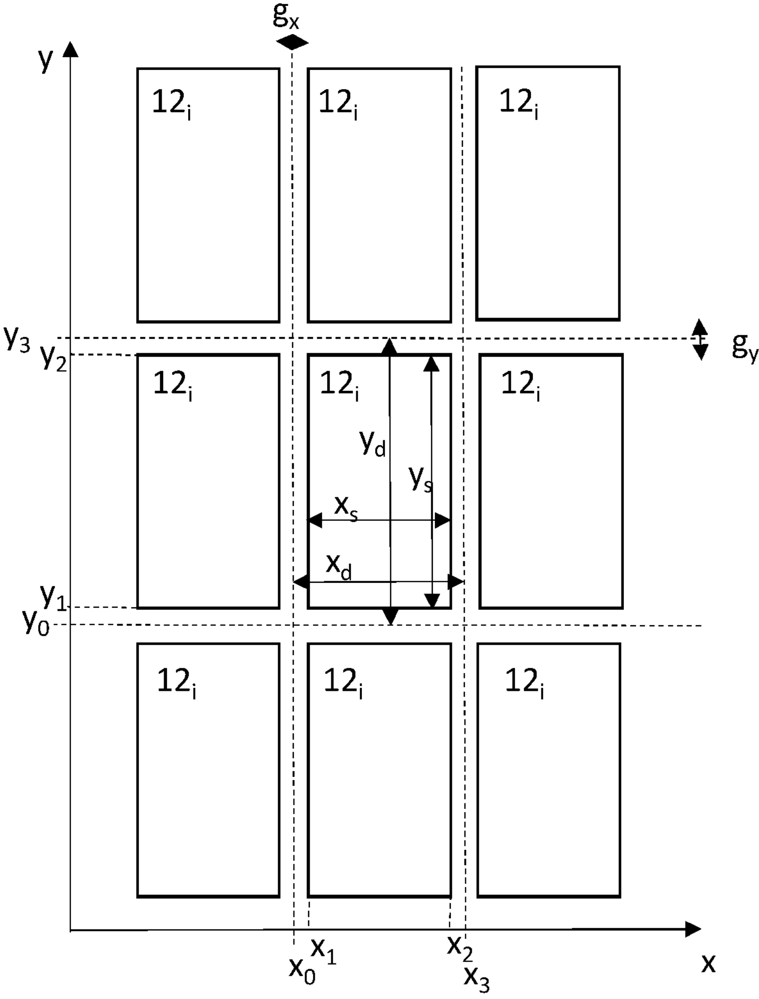
FIG. 4 illustrates a bottom view on a sensor tile of a radiation detector according to an embodiment of the present invention.
Figure 5:
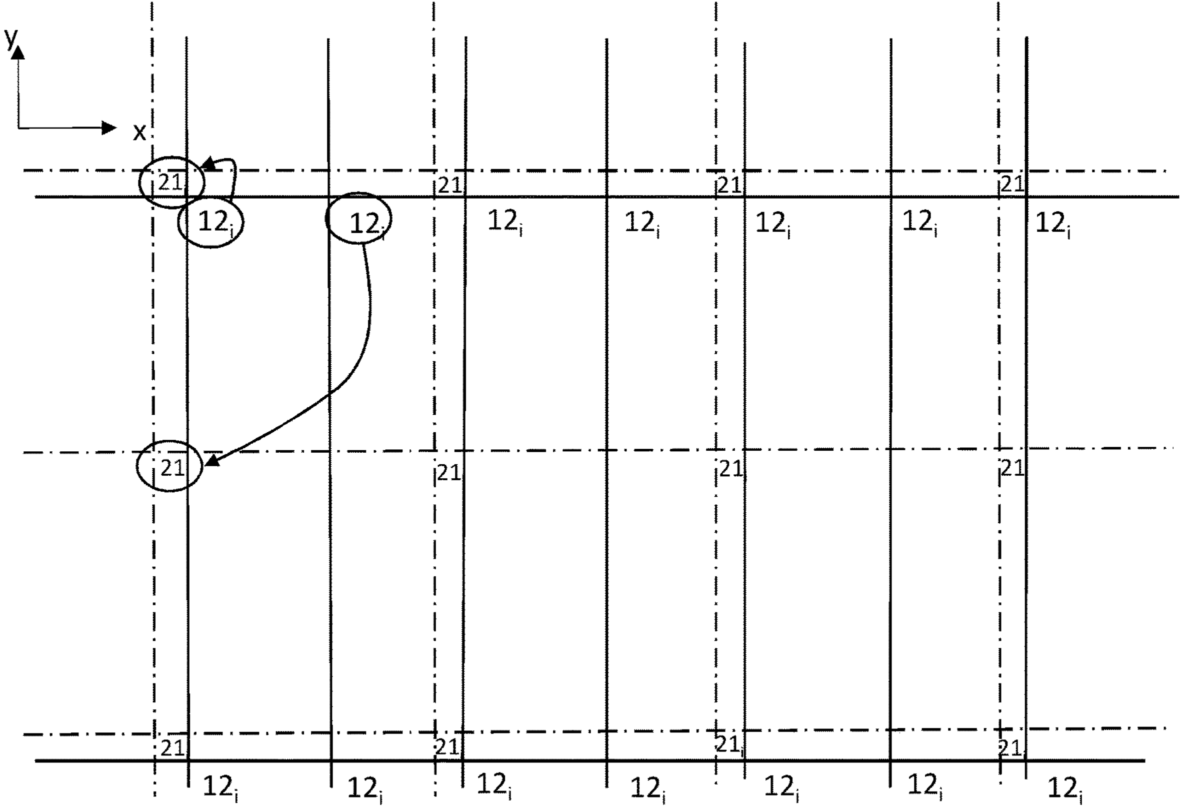
FIG. 5 illustrates a schematic transparent top view on a cutout of a radiation detector according to an embodiment of the present invention.

FIG. 4 illustrates a bottom view on a cutout of a sensor tile 1 as used in a radiation detector according to an embodiment of the present invention. In the present embodiment, a subset of inner sensor pixels $\mathbf{12}_i$ is arranged in an array in rows and columns. Each inner sensor pixel $\mathbf{12}_i$ of the subset shows extensions $x_s$ and $y_s$ of its metallization. A gap between metallizations of the inner sensor pixels $\mathbf{12}_i$ that are neighbors along the first axis x is of size $g_x$. The metallizations of the inner sensor pixels $\mathbf{12}_i$ are illustrated by the straight rectangles. A gap between metallizations that are neighbors along the second axis y is of size $g_y$. For the purpose of comparing the sizes and/or shapes of the readout circuitries with those of the assigned sensor pixels 12, the following assumption is made: An extension $x_d$ of an inner sensor pixel $\mathbf{12}_i$ along the first axis x is set to $x_s+g_x$, while an extension $y_d$ of an inner sensor pixel $\mathbf{12}_i$ along the second axis y is set to $y_s+g_y$ FIG. 5 illustrates a schematic transparent top view on a cutout of a radiation detector according to an embodiment of the present invention. This transparent top view shall illustrate the geometric layout of the sensor pixels 12 relative to the readout circuitries 21 in this specific embodiment. The sensor pixels $\mathbf{12}_i$ have a rectangular shape, defined by their corresponding sensor pixel borders, denoted by solid lines. The readout circuitries $\mathbf{21}_i$ have a quadratic shape, defined by their corresponding readout circuitry borders, denoted by dot/slash lines. Gaps are omitted for illustration purposes.

The aspect ratio $x_d$:$y_d$ of the sensor pixel rectangles is 1:4. The extension along the x-axis (width) of a sensor pixel $\mathbf{12}_i$ is half the extension along the x-axis (width) of a readout circuitry $\mathbf{21}_i$. The extension along the y-axis (height) of a sensor pixel $\mathbf{12}_i$ is double the extension along the y-axis (height) of a readout circuitry $\mathbf{21}_i$. Each two horizontally (in x-direction) neighboring sensor pixels $\mathbf{12}_i$ cover about the same area as two vertically (in y-direction) neighboring readout circuitries $\mathbf{21}_i$.

A connection between two neighboring sensor pixels $\mathbf{12}_i$ to the assigned readout circuitries $\mathbf{21}_i$ may be implemented such that the left sensor pixel $\mathbf{12}_i$ connects to the top readout circuitry $\mathbf{21}_i$, and the right sensor pixel $\mathbf{12}_i$ connects to the bottom readout circuitry. The relations are schematically indicated by arrows. Note that in this embodiment, the sensor pixels $\mathbf{12}_i$ are shifted both in x- and y-direction relative to the readout circuitries $\mathbf{21}_i$.

The electrical connection from the sensor pixel $\mathbf{12}_i$ to the assigned readout circuitry $\mathbf{21}_i$ may be performed in several steps. In a preferred embodiment, the sensor pixel metallization and the readout circuitry contact, e.g. its under bump metalization (UBM), are in the same x-y coordinate but on different parallel planes (shifted vertically). If the projection of the sensor pixel 12*i* on the readout circuitry $\mathbf{21}_i$ does not overlap with the UBM, a rerouting layer may be required.

Figure 6:
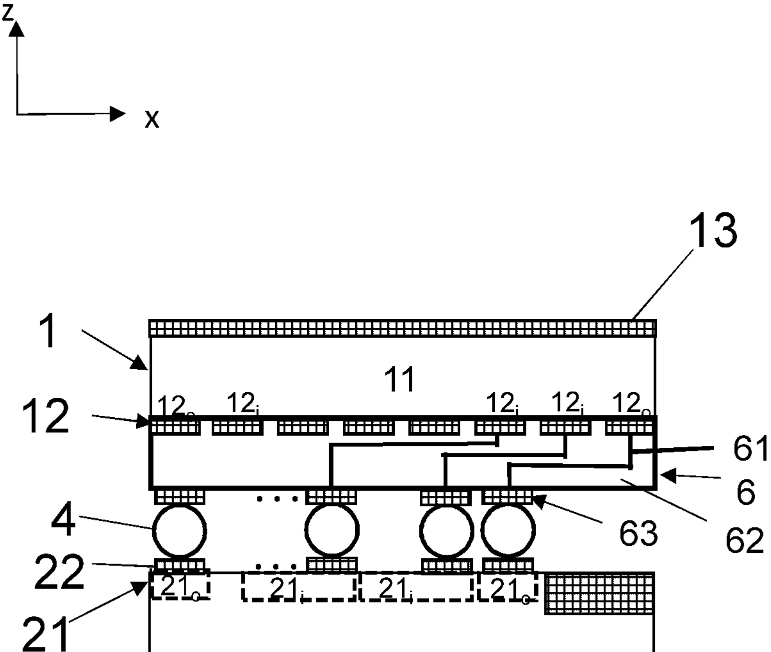
FIG. 6 illustrates a cut view of a radiation detector according to another embodiment of the present invention.

FIG. 6 illustrates another embodiment of a radiation detector according to the present invention, including rerouting between sensor pixels 12 and readout circuitries 21. In addition to the radiation detector of FIG. 1 a redistribution layer 6 is provided, which establishes the electrical one-to-one connection of sensor pixels 12 with corresponding input contacts 22 of readout circuitries 21 through conductor tracks 61 in a dielectric material 62. Contacts 63 of/on the redistribution layer 6 connect to the bump bonds 4 and hence to the contacts 22 of the readout circuitries 21. Typically, the redistribution layer 6 is monolithically integrated on the sensor tile 1. A redistribution layer 6 preferably is applied in case the readout circuitries 62 are laterally offset in x- or y-axis from the assigned sensor pixels 12.

Figure 7:
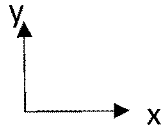
FIGS. 7 to 9 each illustrates a schematic transparent top view on a cutout of a radiation detector according to an embodiment of the present invention.
Figure 7:
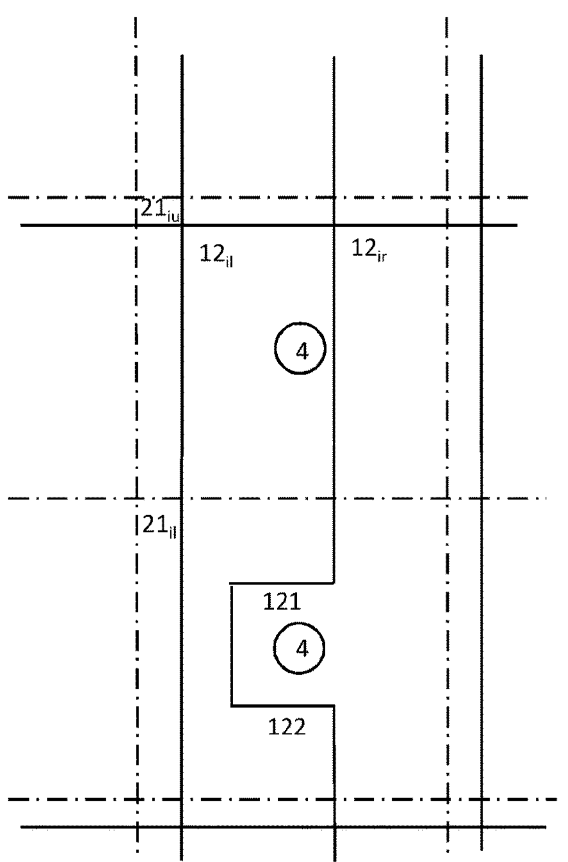

FIG. 7 illustrates a schematic transparent top view on a cutout of a radiation detector according to an embodiment of the present invention. In this embodiment, the inner right sensor pixel $\mathbf{12}_{ir}$, respectively each inner right sensor pixel $\mathbf{12}_{ir}$ of a pair of two neighboring inner sensor pixels $\mathbf{12}_i$ along the first axis x shows a bulge 121 in order to cover the bump bond 4 centered in the assigned inner lower readout circuitry $\mathbf{21}_i$. Hence, the bump bond 4, at the same time representing the x, y location of the contact of the assigned inner lower readout circuitry $\mathbf{21}_i$ can be vertically connected from the inner right sensor pixel $\mathbf{12}_{ir}$ without requiring lateral rerouting. The inner left sensor pixel $\mathbf{12}_{ir}$, respectively each inner left sensor pixel $\mathbf{12}_{ir}$ of a pair of two neighboring inner sensor pixels $\mathbf{12}_i$ along the first axis x, shows a recess 122 complementing the bulge of the inner right sensor pixel $\mathbf{12}_{ir}$, in order not to short circuit the latter. In this embodiment, the contacts 22 and bump bonds 4 can remain all centered on the readout circuitry 21.

Note that a sensor pixel 12 is also considered as rectangular, if it only deviates slightly from a rectangular shape, and in case the deviation is less than a quarter of the readout circuitry extension along the first axis x, and less than a quarter of the readout circuitry extension along the second axis y.

Figure 8:
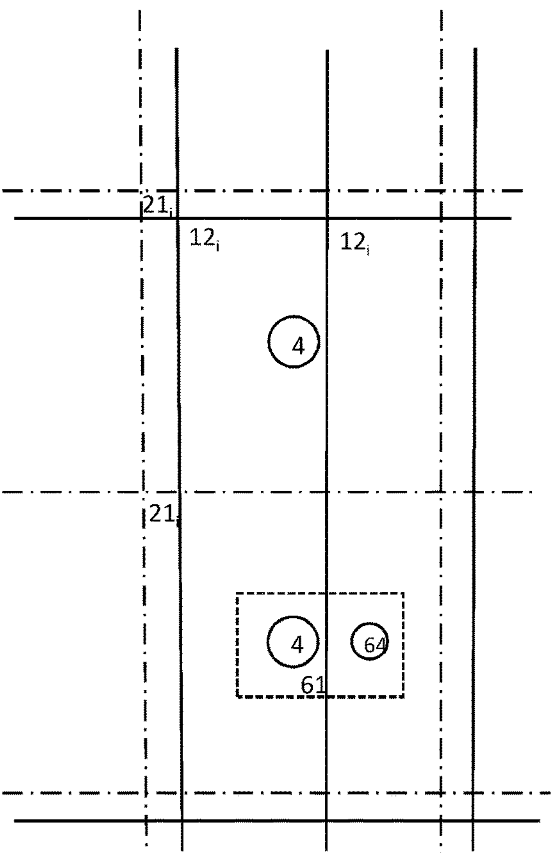

FIG. 8 illustrates a schematic transparent top view on a cutout of a radiation detector according to another embodiment of the present invention. In this embodiment, the rectangular shape of the inner sensor pixels 12*i* are completely preserved. In this embodiment, an insulating layer e.g. of SiO2, SiN, or any other dielectric layer used in semiconductor processing is applied between the inner sensor pixels $\mathbf{12}_i$ and the inner readout circuitries $\mathbf{21}_i$. A via 64 is fabricated (e.g. etched) through the insulating layer such as indicated by 64 in FIG. 6. The hole 64 is metallizied with an electric conductor, resulting in a part of a conductor path 61, see FIG. 6. The bump bond 4 is then connected to the metallized hole 64 with an electrically conductive trace, also 61 in FIG. 6, also made from e.g. copper, silver, aluminium, . . . . In this embodiment, the original rectangular shape of the inner sensor pixel $\mathbf{12}_i$ is preserved.

Figure 9:
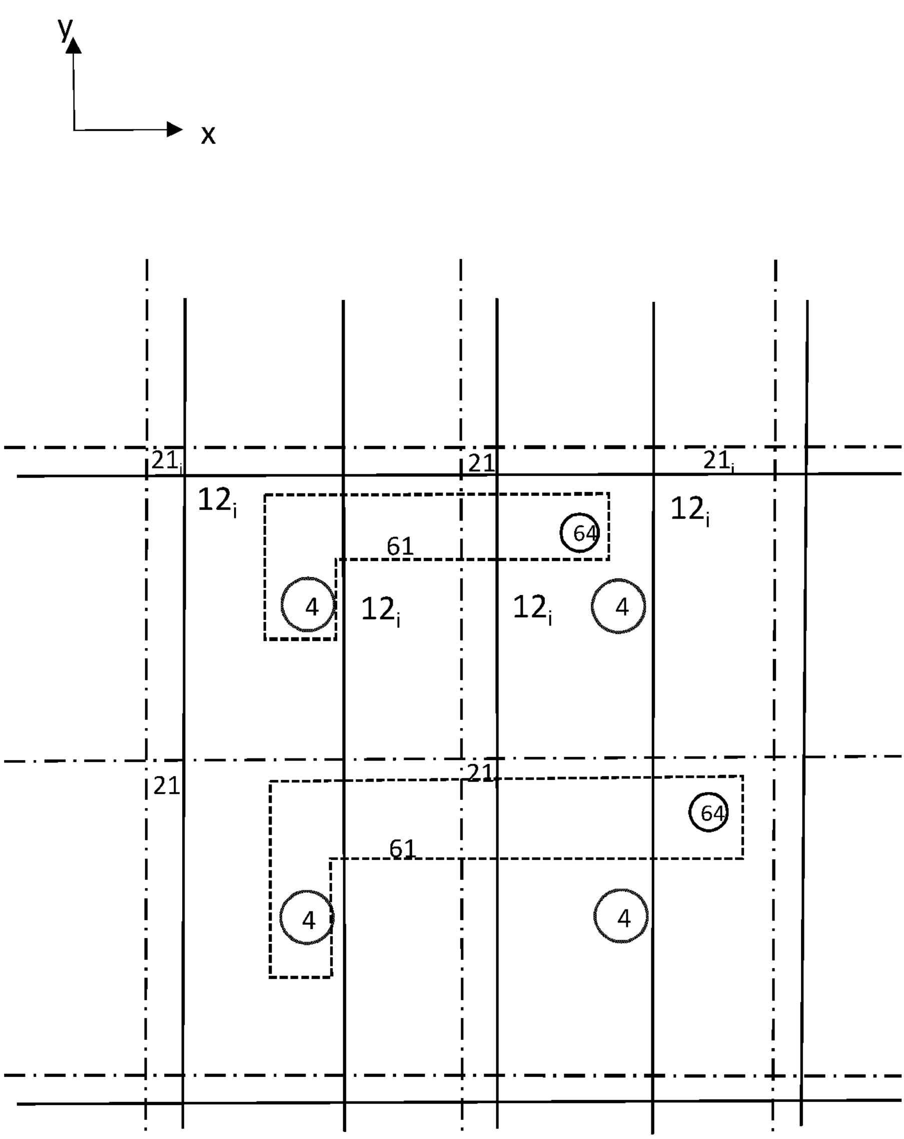

FIG. 9 illustrates a schematic transparent top view on a cutout of a radiation detector according to another embodiment of the present invention. FIG. 9 shows an embodiment of the invention, where the shapes of the readout circuitries $\mathbf{21}_i$ do not overlap with the corresponding sensor pixels $\mathbf{12}_i$.

In this embodiment, an insulating layer e.g. made of SiO2, SiN, or any other insulation layer used in semiconductor processing is applied between the sensor pixels 12$i$ and the inner readout circuitries 21$_i$. A hole 64 is e.g. etched through the insulating layer, and the hole 64 is filled with an electrically conductive material. The location of the bump bond 4 is then connected to the electrically conductive material in the hole 64 with an electrically conductive trace 61, e.g. made from copper, silver, aluminium, . . . . This embodiment is of advantage, in case one wants to choose the resolution of the sensor pixels 12$_i$ e.g. in x-direction as a non-integer divider or multiple of the resolution of the readout circuitries 21$_i$. The x-y area between different readout circuitries 21$_i$ may be covered with sensor pixels 12$_i$ with similar or the same shape as the inner sensor pixels 12$_i$, yielding a uniform resolution in x- or y-direction over the whole sensor tile. In case the routing needs to cover a larger distance crossing a substantial part of a different sensor pixel, then it is advantageous to leave a void of the sensor pixel metallisation where the trace 61 crosses the pixel.

In a different embodiment, the routing is implemented in top layers of the readout chip, in a similar fashion. In a different embodiment, an interposer (e.g. of glass, or Si, ceramics) is used, and routing is implemented on different layers in the interposer.

Note that the routing can be used such that the total area covered by the sensor pixels may differ from the total area covered from the readout circuitries. In particular, the area covered by the sensor pixels may be larger than the area covered by the readout circuitries.

The embodiment described in FIG. 9 can easily be extended to sensor pixels with a different aspect ratio. For an aspect ratio x:y of 1:9, three inner sensor pixels (left, middle horizontal, right), are each connected correspondingly to one of three readout circuitries (top, middle vertical, bottom).

Figure 10:
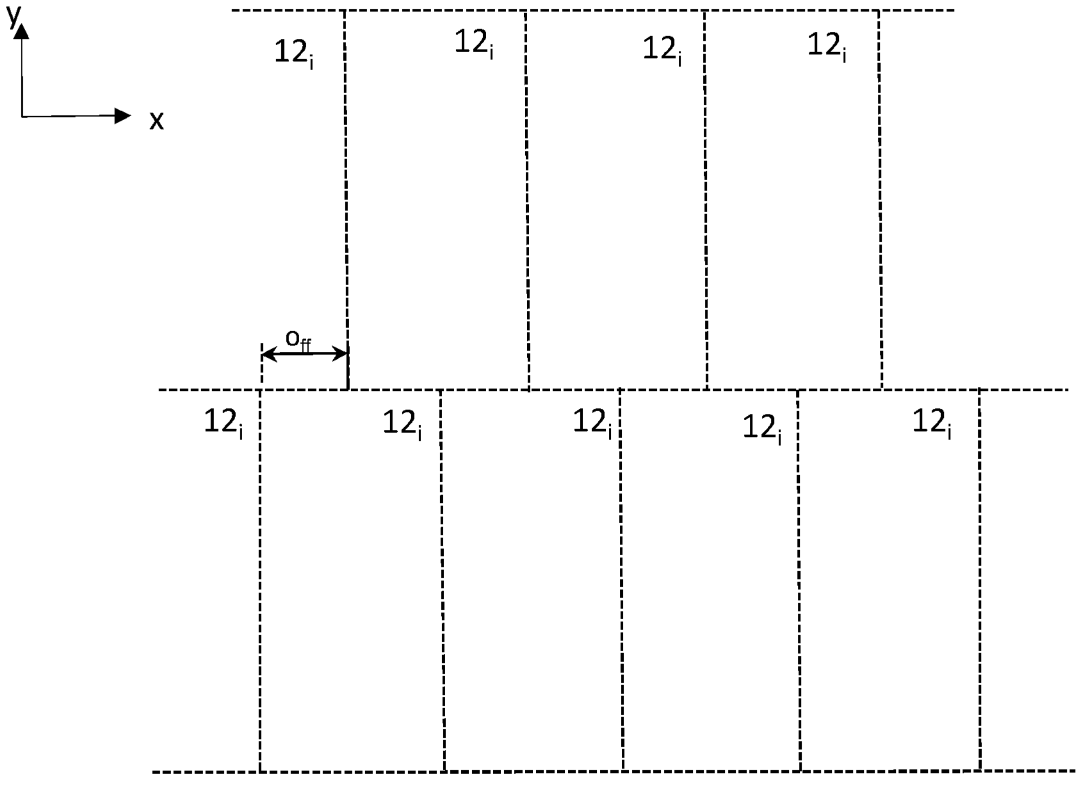
FIG. 10 illustrates a schematic bottom view on a cutout of a sensor tile of a radiation detector according to an embodiment of the present invention.

FIG. 10 illustrates a schematic top view on a cutout of a sensor tile of a radiation detector according to an embodiment of the present invention. In this embodiment, the inner sensor pixels 12$_i$ are of rectangular shape and are arranged in rows offset relative to each other. In the present example, the inner sensor pixels 12$_i$ of adjacent rows are shifted by an offset $o_{ff}$ of half an inner sensor pixel width, i.e. the extension along the x-axis. This allows to achieve an even higher resolution in x-direction. Of course, the pattern of FIG. 10 may repeat in both directions +y/−y, and may continue in +x/−x.

There are further offsets possible, e.g. offsets by ⅓ of the pixel width, or ¼ of the pixel width, or 1/n of the pixel width, where n is smaller or equal to $n_{i,row}-1$ where $n_{i,row}$ is the total number of rows of inner sensor pixels 12$_i$. Instead of shifting the sensor pixels by an offset $+o_{ff}$ per row, “alternating” patterns may be achieved when shifting the sensor pixels by alternating $+o_{ff}$ and $-o_{ff}$ per row.

In this case, each inner sensor pixel row samples at different intervals of the radiation distribution in x-direction. In case the radiation distribution in y-direction does not carry information, i.e. the radiation has at least approximately the same distribution over the y-extension of n offset rows, then the 1D distribution can be reconstructed by this oversampling approach. Combining the signal obtained from the shifted rows enables to acquire the signal with oversampling (i.e. increased sampling resolution) along the x direction.

The invention claimed is:

1. Radiation detector for position-resolved detection of radiation, comprising at least one sensor tile with sensor material sensitive to the radiation, the sensor tile defining a horizontal plane spanned by a first axis and a second axis orthogonal to the first axis, a set of sensor pixels arranged in the horizontal plane, each sensor pixel comprising electrically conductive material in contact with the sensor material, wherein the set of sensor pixels comprises a subset of inner sensor pixels, where-in an inner sensor pixel has a neighbor sensor pixel in each direction of the first axis and the second axis, wherein at least two neighboring inner sensor pixels of the subset show an extension along the second axis that exceeds an extension along the first axis, wherein the extension of an inner sensor pixel along the first axis is determined by an extension of its conductive material along the first axis plus a distance of a gap between the inner sensor pixel and an inner sensor pixel arranged adjacent in direction of the first axis, wherein the extension of an inner sensor pixel along the second axis is deter-mined by an extension of its conductive material along the second axis plus a distance of a gap between the inner sensor pixel and an inner sensor pixel arranged adjacent in direction of the second axis, at least one readout chip assigned to the at least one sensor tile and extending along the first axis and the second axis, a set of readout circuitries integrated in the readout chip, each readout circuitry of the set comprising a contact, and each readout circuitry, via its contact, being electrically connected to one of the sensor pixels of the set for reading out a charge entry from the as-signed sensor pixel, wherein the set of readout circuitries comprises a subset of inner readout circuitries, wherein an inner readout circuitry has a readout circuitry in each direction of the first axis and the second axis, wherein an extension of each inner readout circuitry along the first axis is de-fined by a distance between the contacts of the two outmost inner readout circuitries on the first axis divided by $N_i-1$, with $N_i$ representing the number of inner readout circuitries along the first axis, wherein an extension of each inner readout circuitry along the second axis is defined by a distance between the contacts of the two outmost inner readout circuitries on the second axis divided by $M_i-1$, with $M_i$ representing the number of inner readout circuitries along the second axis, wherein each of the two inner readout circuitries assigned and connected to the two neighboring inner sensor pixels shows an extension along the first axis that is different from the extension of the assigned inner sensor pixel along the first axis, and/or an extension along the second axis that is different from the extension of the assigned inner sensor pixel along the second axis.

2. Radiation detector according to claim 1, wherein the two neighboring inner sensor pixels show the same extension along the first axis and the same extension along the second axis, preferably wherein the two neighboring inner sensor pixels are of the same rectangular shape, preferably wherein the two neighboring inner sensor pixels each show an extension along the second axis that exceeds an extension along the first axis at least by factor four, preferably wherein all inner sensor pixels of the subset are of the same rectangular shape, preferably wherein all sensor pixels of the set are of the same rectangular shape.

3. Radiation detector according to claim 1, wherein at least four, and preferably all inner sensor pixels of the subset are of the same rectangular shape and are arranged in a two-dimensional array along the first and the second axis.

4. Radiation detector according to claim 1, wherein at least four, and preferably all inner sensor pixels of the subset are of the same rectangular shape and are arranged in one of rows and columns offset relative to each other, preferably wherein the offset is at maximum half of the extension of the inner sensor pixel along the offset axis, preferably wherein the offset is half of the extension of the inner sensor pixel along the offset axis, preferably wherein the offset is a third of the extension of the inner sensor pixel along the offset axis, preferably wherein the offset is the sensor pixel extension in the offset axis divided by an integer, wherein the maximum integer is less than a number of readout circuitries along the axis orthogonal to the offset axis.

5. Radiation detector according to claim 1, wherein each of the two neighboring inner sensor pixels being of the same rectangular shape comprises a local asymmetry at which local asymmetry an electrical contact means engages with the inner sensor pixel for connecting the inner sensor pixel to the assigned inner readout circuitry, preferably wherein the local asymmetry is represented by a bulge in the shape of the inner sensor pixel, preferably wherein each of the two neigh-boring inner sensor pixels comprises another local asymmetry in form of a recess complementing the bulge of the neighboring sensor pixel.

6. Radiation detector according to claim 1, wherein the two inner readout circuitries each show the same extension along the first axis and along the second axis, preferably wherein the two inner readout circuitries are of the same quadratic shape, preferably wherein all inner readout circuitries of the subset are of the same quadratic shape, preferably wherein all readout circuitries of the set are of the same quadratic shape.

7. Radiation detector according to claim 1, wherein at least four, and preferably all inner readout circuitries of the subset are of the same quadratic shape and are arranged in a two-dimensional array along the first and the second axis.

8. Radiation detector according to claim 1, wherein the extension of each of the two inner readout circuitries along the first axis exceeds the extension of the assigned inner sensor pixel along the first axis.

9. Radiation detector according to claim 8, wherein the extension of each of the two inner readout circuitries-along the second axis is less than the extension of the as-signed inner sensor pixel along the second axis.

10. Radiation detector according to claim 8, wherein the extension of each of the two inner readout circuitries-along the first axis is at least twice the extension of the as-signed sensor pixel along the first axis.

11. Radiation detector according to claim 10, wherein the extension along the second axis of each of the two inner readout circuitries is half the extension of the assigned sensor pixel along the second axis or less.

12. Radiation detector according to claim 11, wherein the extension along the first axis of each of the two inner readout circuitries is twice the extension of the assigned sensor pixel along the first axis, and wherein the extension along the second axis of each of the two inner readout circuitries is half the extension of the assigned sensor pixel along the second axis.

13. Radiation detector according to claim 11, wherein the extension along the first axis of each of the two inner readout circuitries is 3/2 times the extension of the assigned sensor pixel along the first axis, and wherein the extension along the second axis of each of the two inner readout circuitries is ⅔ times the extension of the assigned sensor pixel along the second axis.

14. Radiation detector according to claim 1, wherein the two neighboring inner sensor pixels are arranged next to each other along the first axis in combination spanning a rectangle, wherein the assigned two inner readout circuitries are arranged next to each other along the second axis thereby spanning a rectangle congruent with the rectangle spanned by the two neighboring inner sensor pixels.

15. Radiation detector according to claim 14, wherein the rectangle spanned by the two neighboring inner sensor pixels has the same position along the first and the second axis as the rectangle spanned by the assigned two inner readout circuitries.

16. Radiation detector according to claim 14, wherein the rectangle spanned by the two neighboring inner sensor pixels does not overlap with the rectangle spanned by the assigned two inner readout circuitries.

17. Radiation detector according to claim 1, wherein at least one of the two inner readout circuitries of the subset is out of over-lap with the assigned sensor pixel.

18. Radiation detector according to claim 1, wherein each of the inner sensor pixels of the subset claims an area exceeding the area claimed by the assigned inner readout circuitry, the area of which assigned inner readout circuitry is determined by its extension along the first axis times its extension along the second axis.

19. Radiation detector according to claim 1, wherein all inner sensor pixels of the subset claim a combined area exceeding a combined area of all inner readout circuitries of the subset, the combined area being determined by the extension of the inner readout circuitry along the first axis times its extension along the second axis times the number of inner readout circuitries.

20. Radiation detector according to claim 1, comprising a rerouting layer between the sensor tile and the readout chip for electrically connecting the sensor pixels to the contacts of the assigned readout circuitries, preferably wherein the rerouting layer comprises an insulating material including conductive traces arranged between the sensor tile and the readout chip.

* * * * *